US011320393B1

(12) United States Patent
Elsayed et al.

(10) Patent No.: US 11,320,393 B1
(45) Date of Patent: May 3, 2022

(54) GAS SENSOR FOR DETECTION OF TOXIC GASES

(71) Applicant: King Abdulaziz University, Jeddah (SA)

(72) Inventors: Waleed Elsayed Mahmoud Elsayed, Jeddah (SA); Ahmed Abdullah Salem Al-Ghamdi, Jeddah (SA); Yusuf Abdulaziz Al-Turki, Jeddah (SA)

(73) Assignee: King Abdulaziz University, Jeddah (SA)

( * ) Notice: Subject to any disclaimer, the term of this patent is extended or adjusted under 35 U.S.C. 154(b) by 0 days.

(21) Appl. No.: 17/392,852

(22) Filed: Aug. 3, 2021

(51) Int. Cl.
| | |
|---|---|
| *G01N 27/407* | (2006.01) |
| *G01N 27/30* | (2006.01) |
| *H01L 21/02* | (2006.01) |
| *B82B 3/00* | (2006.01) |
| *B82Y 15/00* | (2011.01) |
| *B82Y 40/00* | (2011.01) |

(52) U.S. Cl.
CPC ......... *G01N 27/407* (2013.01); *B82B 3/0014* (2013.01); *B82Y 15/00* (2013.01); *B82Y 40/00* (2013.01); *G01N 27/304* (2013.01); *H01L 21/02181* (2013.01)

(58) Field of Classification Search
CPC .. G01N 27/407; G01N 27/304; B82B 3/0014; B82Y 15/00; B82Y 40/00; H01L 21/02181; H01L 21/31645; H01L 2924/01072; B01J 20/0211
USPC .................................. 423/69, 297, 492, 608
See application file for complete search history.

(56) References Cited

U.S. PATENT DOCUMENTS

| | | | |
|---|---|---|---|
| 7,631,540 B2 | 12/2009 | Chueh et al. | |
| 8,202,761 B2 | 6/2012 | Cho et al. | |
| (Continued) | | | |

FOREIGN PATENT DOCUMENTS

| | | |
|---|---|---|
| KR | 10-2008-0109002 | 12/2008 |
| KR | 10-1364138 | 2/2014 |
| KR | 10-1716966 | 3/2017 |
| (Continued) | | |

OTHER PUBLICATIONS

Berger, et al., Self-Ordered Hexagonal Nanoporous Hafnium Oxide and Transition to Aligned HfO2 Nanotube Layers, Electrochemical and Solid-State Letters 2009; 12(7): K45-K48. (Year: 2009).*

(Continued)

*Primary Examiner* — Daniel C. McCracken
(74) *Attorney, Agent, or Firm* — Oblon, McClelland, Maier & Neustadt, L.L.P.

(57) ABSTRACT

A method of making an array of aligned hafnium oxide nanotubes is provided. The method includes generating a first reactant gas from a first solution comprising a first hafnium precursor dissolved in a first solvent. Directing the flow of the first reactant gas over a substrate to form a seed layer that comprises particles of hafnium oxide. The method further includes generating a second reactant gas from a second solution comprising a second hafnium precursor dissolved in a second solvent. Directing the flow of the second reactant gas over the seed layer to form the array of aligned hafnium oxide nanotubes substantially perpendicular on a surface of the substrate. A method of using the array of aligned hafnium oxide tubes for detection of toxic gases in a gas sample is also provided.

20 Claims, 11 Drawing Sheets

(56) References Cited

U.S. PATENT DOCUMENTS 9,341,590 B2    5/2016    Kim et al.
2004/0168627 A1    9/2004    Conley, Jr. et al.

FOREIGN PATENT DOCUMENTS

| | | |
|---|---|---|
| KR | 10-1792438 | 10/2017 |
| KR | 10-1912892 | 10/2018 |
| KR | 10-2009938 | 8/2019 |
| WO | 2015/058495 A1 | 4/2015 |

OTHER PUBLICATIONS

Sarkar, et al. ; Synthesize of ZnO Nano structure for toxic gas sensing application ; Procedia Computer Science 92 ; pp. 199-206; 2016 ; 8 Pages.

Kim, et al. ; Sensor Array based on Metal Oxide Semiconductors for Detecting Gas Mixtures and Its Sensing Properties ; Department of Materials Science and Engineering, The University of Seoul ; SENSORNETS 2016 ; 6 Pages.

Sabry, et al. ; Synthesis of ZnO Nanostructure by Sol-Gel Spin Coating Method ; International Review of Physics vol. 7, No. 6 ; 2013 ; 4 Pages ; Abstract Only.

Kartik, et al. ; Design, Simulation and Optimisation of an Arrayed Gas Sensor using Metal Oxide based Nanowires ; 2018 IEEE Electron Devices Kolkata Conference ; Nov. 24-25, 2018 ; 2 Pages ; Abstract Only.

Dickey, et al. ; Fabrication of Arrays of Metal and Metal Oxide Nanotubes by Shadow Evaporation ; ACSNANO vol 2. No. 4 ; 10 Pages.

\* cited by examiner

GAS SENSOR FOR DETECTION OF TOXIC GASES

BACKGROUND OF THE INVENTION

Field of the Invention

The present disclosure relates to a gas sensor, and, more particularly relates, to a gas sensor containing hafnium oxide nanotubes for the detection of toxic gases.

Description of the Related Art

With the increase in usage of automobiles in day-to-day life, the level of toxic gases in the air increases as well which results in high levels of air pollution. The presence of toxic gases such as sulfur dioxide, nitrogen oxide, carbon monoxide, etc. in the air leads to a high risk to humans and the environment. The rising concentration of such toxic gases takes a huge toll on human health causing serious health issues like emphysema, asthma, cancer, etc. Gas sensors are used to detect the concentration of toxic gases in the air by converting the chemical information into corresponding electrical signals.

Various commercial gas sensors are known to include organic materials, carbon black, or a combination thereof as the sensing material which react with the toxic gas and convert the chemical information into the corresponding electrical signal. These materials have certain drawbacks such as low electrical conductivity, low sensitivity, and failure at high temperatures. Further, the sensing material needs to be free from impurities to provide the high sensing ability, and therefore the methods employed for manufacturing the sensing materials are critically important.

Hafnium oxide (also known as hafnium (IV) oxide, hafnium dioxide, and hafnia) is an inorganic compound having the formula $HfO_2$. Hafnium oxide adopts a variety of crystal structures including a monoclinic phase, a tetragonal phase, multiple orthorhombic phases (including Pcba and Pnma phases), and a cubic phase. As with most metal oxides, certain properties of hafnium oxide are dependent upon the crystal structure the material adopts, such as dielectric constant and ferroelectric behavior. Pure $HfO_2$ exists in the monoclinic phase (m-$HfO_2$) in standard conditions, however it transforms to the tetragonal phase (t-$HfO_2$) under atmospheric pressure and high temperature ($T \geq 1700°$ C.), and becomes cubic-phase (c-$HfO_2$) with further heating ($T \geq 2600°$ C.). The formation of pure bulk t-$HfO_2$ and c-$HfO_2$ at room temperature (or low temperature) is considered impossible by some researchers, even with ultrafast quenching, because of the comparably low free surface energies [Kumar, N., et. al., Scientific Reports, 2017, Article Number 9351]. Various strategies have been employed, however, to stabilize the tetragonal and cubic phases under certain criteria, such as $HfO_2$ doped with other metals (particularly trivalent rare earth elements) and nanostructures such as thin films [Manory, R. R., et. al., Journal of Vacuum Science and Technology A, 2002, 20, 2, 549; Dubourdieu, C., et. al., Journal of Vacuum Science and Technology A, 2009, 27, 3, 503; Chen, G. H., et. al., Journal of Applied Physics, 2008, 104, 7, 074101; Sekar, N., et. all, Journal of Nanoscience and Nanotechnology, 2020, 20, 2; Kumar, S. and Rath, C., Physica Status Solidi A, 2020, 217, 1, 1900756; and Lederer, M., et. al., Appl. Phys. Lett. 2021, 118, 012901].

SUMMARY OF THE INVENTION

Aspects of the invention provide a method of making an array of aligned hafnium oxide nanotubes. The method comprises generating a first reactant gas from a first solution comprising a first hafnium precursor dissolved in a first solvent; flowing the first reactant gas over a substrate at 120 to 200° C. to form a seed layer; generating a second reactant gas from a second solution comprising a second hafnium precursor dissolved in a second solvent; and flowing the second reactant gas over the seed layer at 120 to 200° C. to form the array of aligned hafnium oxide nanotubes, wherein the seed layer comprises particles of hafnium oxide; the hafnium oxide nanotubes are cubic hafnium oxide; and the hafnium oxide nanotubes are aligned substantially perpendicular to a surface of the substrate.

In some embodiments, the first hafnium precursor is at least one selected from the group consisting of hafnium acetate, hafnium formate, hafnium acetylacetonate, hafnium trifluoroacetate, and hafnium hexafluoroacetylacetonate.

In some embodiments, the seed layer comprises particles of hafnium oxide having a mean particle size of 10 to 35 nm.

In some embodiments, the second hafnium precursor may be at least one selected from the group consisting of hafnium nitrate, hafnium sulfate, hafnium chloride, hafnium bromide, hafnium (IV) iodide, hafnium (III) iodide, and hafnium trifluoromethanesulfonate.

In some embodiments, the first solvent may be an alcohol and the second solvent may be water.

In some embodiments, the hafnium oxide nanotubes have a mean length of 100 to 150 nm, a mean inner diameter of 10 to 25 nm, a mean outer diameter of 11 to 35 nm, and a mean tube wall thickness of 1 to 10 nm.

In some embodiments, the hafnium oxide nanotubes are crystalline by PXRD.

In some embodiments, the substrate is indium tin oxide disposed upon a glass support.

In some embodiments, the method of making the array of aligned hafnium oxide nanotubes further comprises disposing a pair of electrodes, a first electrode being disposed on the conducting or semiconducting substrate and a second electrode being disposed on a portion of the array of aligned hafnium oxide nanotubes. In some embodiments, the method further comprises removing a portion of the array to create a first region and a second region. Each of the first electrode and the second electrode may comprise a metal selected from the group consisting of copper, gold, silver, nickel, platinum, titanium, and tungsten.

Aspects of the invention provide a gas sensor, comprising: a conducting or semiconducting substrate, an array of aligned hafnium oxide nanotubes disposed on a surface of the conducting or semiconducting substrate and substantially perpendicular to the conducting or semiconducting substrate, the nanotubes having a mean length of 100 to 150 nm, a mean inner diameter of 10 to 25 nm, a mean outer diameter of 11 to 35 nm, and a mean tube wall thickness of 1 to 10 nm; and a pair of electrodes separated by an electrode separation distance, one of the electrodes being disposed on the conducting or semiconducting substrate and another of the electrodes being disposed on a portion of the array.

In some embodiments, the conducting or semiconducting substrate is indium tin oxide.

In some embodiments, the hafnium oxide of the aligned hafnium oxide nanotubes is cubic hafnium oxide.

Aspects of the invention provide a method of detecting a toxic gas in a gas sample, the method comprising: applying a voltage to the pair of electrodes of the gas sensor; contacting the array of aligned hafnium oxide nanotubes of the gas sensor with the gas sample; and measuring an electric current through the gas sensor, wherein changes in the electric current indicate the presence of the toxic gas.

In some embodiments, the toxic gas present in the gas sample is present in an amount of 0.0001 to 1000 ppb based on a total number of parts in the gas sample.

In some embodiments, the toxic gas is at least one selected from the group consisting of ammonia, hydrogen sulfide, and nitrogen dioxide.

In some embodiments, the method of detecting the toxic gas may have a response time of 0.5 to 3 sec and a recovery time of 0.5 to 2.5 seconds.

In some embodiments, the method of detecting the toxic gas may use a magnitude of the changes in the electric current to calculate a concentration of the toxic gas in the gas sample.

BRIEF DESCRIPTION OF THE DRAWINGS

A more complete appreciation of the invention and many of the attendant advantages thereof will be readily apparent as the same becomes better understood by reference to the following detailed description when considered in connection with the accompanying drawings, wherein:

FIG. 8C shows a graphical representation of response time and recovery time with change in concentration of $NO_2$ gas, according to an embodiment of the present disclosure;

DETAILED DESCRIPTION OF THE INVENTION

Figure 1:
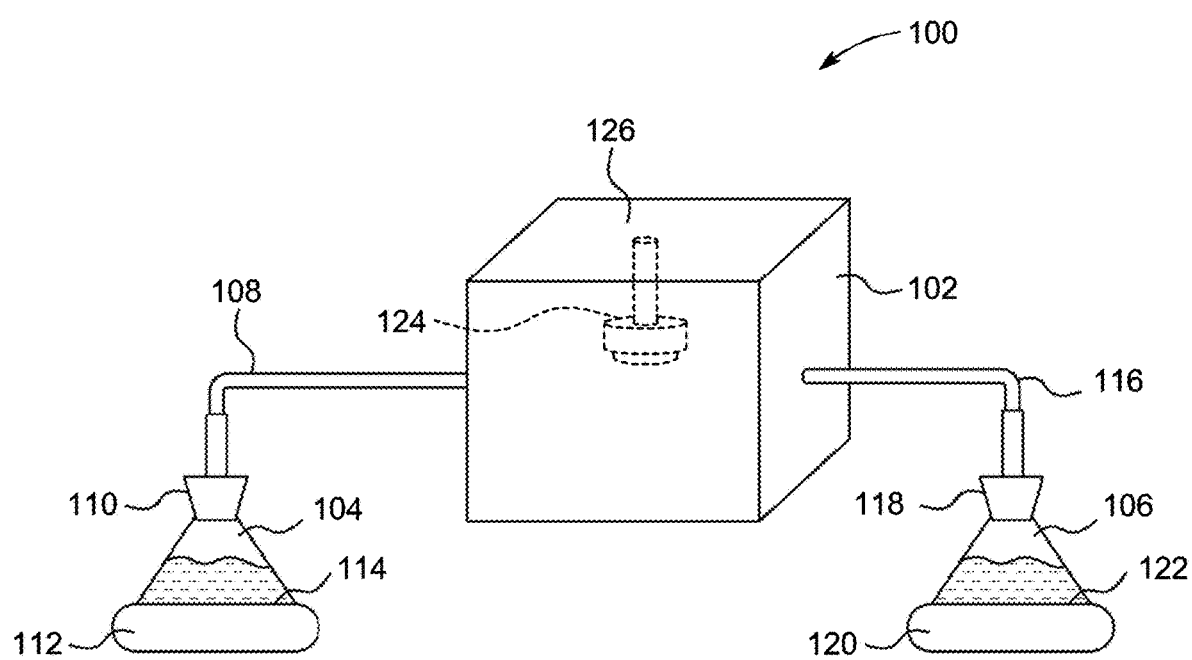
FIG. 1 shows an experimental setup for making an array of hafnium oxide nanotubes of the gas sensor, according to an embodiment of the present disclosure.

In the following description, it is understood that other embodiments may be utilized, and structural and operational changes may be made without departure from the scope of the present embodiments disclosed herein.

Reference will now be made in detail to specific embodiments or features, examples of which are illustrated in the accompanying drawings. Wherever possible, corresponding, or similar reference numbers will be used throughout the drawings to refer to the same or corresponding parts. Moreover, references to various elements described herein, are made collectively or individually when there may be more than one element of the same type. However, such references are merely exemplary in nature. It may be noted that any reference to elements in the singular may also be construed to relate to the plural and vice-versa without limiting the scope of the disclosure to the exact number or type of such elements unless set forth explicitly in the appended claims.

As used herein, the terms "optional" or "optionally" means that the subsequently described event(s) can or cannot occur or the subsequently described component(s) may or may not be present (e.g., 0 wt. %). As used herein the words "a" and "an" and the like carry the meaning of "one or more."

In addition, the present disclosure is intended to include all isotopes of atoms occurring in the present compounds and complexes. Isotopes include those atoms having the same atomic number but different mass numbers. By way of general example, and without limitation, isotopes of hydrogen include deuterium and tritium. Isotopes of oxygen include $^{16}O$, $^{17}O$, and $^{18}O$. Isotopes of hafnium include $^{174}Hf$, $^{176}Hf$, $^{177}Hf$, $^{178}Hf$, $^{179}Hf$, and $^{180}Hf$. Isotopically-labeled compounds of the disclosure may generally be prepared by conventional techniques known to those skilled in the art or by processes analogous to those described herein, using an appropriate isotopically-labeled reagent in place of the non-labeled reagent otherwise employed.

Method of Making an Array of Aligned Hafnium Oxide Nanotubes

According to a first aspect, the present disclosure relates to a method of making an array of aligned hafnium oxide nanotubes. The method comprises generating a first reactant gas from a first solution comprising a first hafnium precursor dissolved in a first solvent; flowing the first reactant gas over a substrate at 120 to 200° C., preferably 125 to 190° C., preferably 130 to 175° C., preferably 135 to 165° C., preferably 140 to 160° C., preferably 142.5 to 157.5° C., preferably 145 to 155° C., preferably 147.5 to 152.5° C., preferably 150° C. to form a seed layer; generating a second reactant gas from a second solution comprising a second hafnium precursor dissolved in a second solvent; and flowing the second reactant gas over the seed layer at 120 to 200° C., preferably 125 to 190° C., preferably 130 to 175° C., preferably 135 to 165° C., preferably 140 to 160° C., preferably 142.5 to 157.5° C., preferably 145 to 155° C., preferably 147.5 to 152.5° C., preferably 150° C. to form the array of aligned hafnium oxide nanotubes, wherein the seed layer comprises particles of hafnium oxide; the hafnium oxide nanotubes are cubic hafnium oxide; and the hafnium oxide nanotubes are aligned substantially perpendicular to a surface of the substrate.

FIG. 1 illustrates an exemplary setup 100 for making the array of hafnium oxide nanotubes, according to an embodiment of the present disclosure. The setup 100 includes an electric oven 102, a first flask 104, and a second flask 106. The first flask 104 and the electric oven 102 may be connected by a first tube 108 to transfer the material from the first flask 104 to the electric oven 102. The first flask 104 includes a first stopper 110 holding one end of the first tube 108. The first flask 104 further includes a first hot plate 112 below a first base 114 of the first flask 104 to heat the material inside the first flask 104.

The second flask 106 and the electric oven 102 may be connected by a second tube 116 to transfer the material from the second flask 106 to the electric oven 102. The second flask 106 includes a second stopper 118 holding one end of the second tube 116. Further, the second flask 106 includes a second hot plate 120 below a second base 122 of the second flask 106 to heat the material inside the second flask 106.

In some embodiments, the first tube 108 and/or the second tube 116 may be manufactured using polymer material such as, but not limited to tygon®, fluoroelastomer, hypalon rubber, silicone rubber, thermoplastic rubber. In some embodiments, the first tube 108 and/or the second tube 116 may be manufactured using metal, for example stainless steel, aluminum, or brass. In some embodiments, the first tube 108 and/or the second tube 116 may be manufactured using glass, for example soda lime glass or borosilicate glass. The setup 100 further includes a substrate holder 124 attached inside and on a top surface 126 of the electric oven 102. In some embodiments, is attachment is oriented such that the substrate held to it has an operational surface facing downward. Alternatively, the substrate may be held with the operational surface facing upward. The substrate holder 124 is used to hold the substrate on which the nanotubes may be formed.

Figure 2:
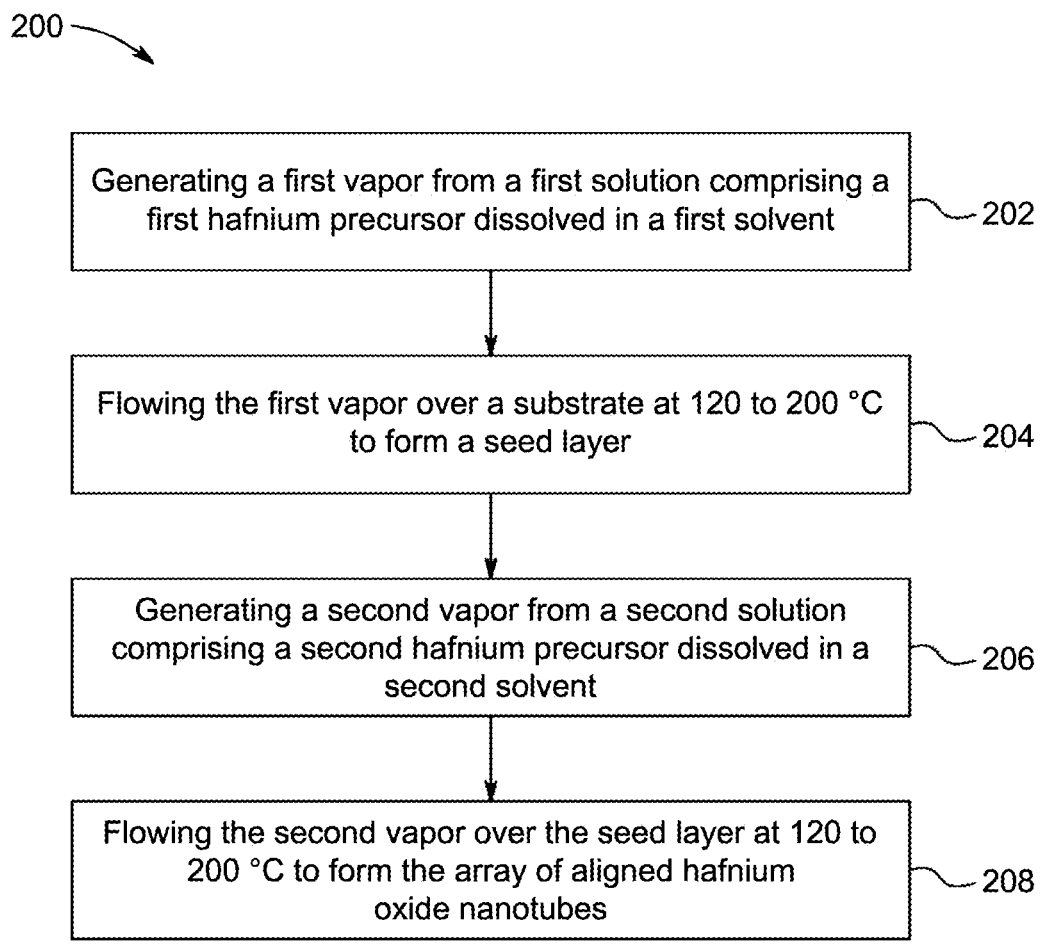
FIG. 2 is a schematic flow diagram of a method of making an array of aligned hafnium oxide nanotubes, according to an embodiment of the present disclosure.

FIG. 2 illustrates a schematic flow diagram of a method 200 of making an array of aligned hafnium oxide nanotubes, according to an embodiment of the present disclosure. At step 202, the method 200 includes generating a first reactant gas from a first solution comprising a first hafnium precursor dissolved in a first solvent. The first solution may be formed in the first flask 104, heated by the first hot plate 112 forming the first reactant gas.

At step 204, the method 200 includes flowing the first reactant gas over the conducting or semiconducting substrate at a first temperature of the electric oven 102 that is in the range of about 120° C. to about 200° C. as described above to form a seed layer. The first reactant gas flows through the first tube 108 from the first flask 104 to the electric oven 102 and gets deposited on the conducting or semiconducting substrate to form the seed layer.

At step 206, the method 200 includes generating a second reactant gas from a second solution comprising a second hafnium precursor dissolved in a second solvent. The second solution may be formed in the second flask 106, heated by the second hot plate 120 forming the second reactant gas.

At step 208, the method 200 includes flowing the second reactant gas over the seed layer at a second temperature of the electric oven 102 that is in the range of about 120° C. to about 200° C. as described above to form the nanotubes. The second reactant gas flows through the second tube 116 from the second flask 106 to the electric oven 102 and gets deposited on the seed layer to form the nanotubes. The nanotubes are formed on the surface of the conducting or semiconducting substrate and substantially perpendicular to the conducting or semiconducting substrate (see FIGS. 3A-3C). Further, the nanotubes are cubic hafnium oxide. In one embodiment, the nanotube may be crystalline as measured by Powder X-ray diffraction (PXRD), see FIG. 3D.

In some embodiments, the first hafnium precursor is at least one selected from the group consisting of hafnium acetate, hafnium formate, hafnium acetylacetonate, hafnium trifluoroacetate, and hafnium hexafluoroacetylacetonate. In preferred embodiments, the first precursor is hafnium acetate. Examples of solvents which may act as the first solvent include, but are not limited to hexane, petroleum ether, diethyl ether, ethyl acetate, chloroform, dichloromethane, acetone, n-butanol, isopropanol, n-propanol, ethanol, methanol, water, acetaldehyde, acetic acid, acetonitrile, 1,2-butanediol, 1,3-butanediol, 1,4-nutanediol, 2-butoxyethanol, butyric acid, diethanolamine, diethylenetriamine, dimethylformamide, dimethoxyethane, dimethyl sulfoxide, 1,4-dioxane, ethylamine, ethylene glycol, formic acid, furfuryl alcohol, glycerol, methyl diethanolamine, methyl isocyanide, N-methyl-2-pyrrolidone, 1,3-propanediol, 1,5-pentanediol, propanoic acid, propylene glycol, pyridine, tetrahydrofuran, triethylene glycol, diglyme, and mixtures thereof. In some embodiments, the first solvent is an alcohol, for example methanol, ethanol, n-propanol, isopropanol, n-butanol, isobutanol, or n-pentanol. In preferred embodiments, the solvent is selected from the group consisting of methanol, ethanol, and isopropanol. In some embodiments, the first hafnium precursor is present in the first solution in an amount of 0.10 to 10.0 mg/mL, preferably 0.15 to 9.0 mg/mL, 0.20 to 8.0 mg/mL, preferably 0.25 to 7.5 mg/mL, preferably 0.30 to 7.0 mg/mL, preferably 0.35 to 6.5 mg/mL, preferably 0.40 to 6.0 mg/mL, preferably 0.45 to 5.5 mg/mL, preferably 0.50 to 5.0 mg/mL, preferably 0.55 to 4.5 mg/mL, preferably 0.60 to 4.0 mg/mL, preferably 0.65 to 3.5 mg/mL, preferably 0.70 to 3.0 mg/mL, preferably 0.75 to 2.5 mg/mL, preferably 0.80 to 2.0 mg/mL, preferably 0.85 to 1.75 mg/mL, preferably 0.90 to 1.50 preferably 0.95 to 1.25 mg/mL, preferably about 1.0 mg/mL. The generation of the first reactant gas may involve heating of the first solution. In some embodiments, the first solution is heated to 30 to 100° C., preferably 35 to 95° C. preferably 40 to 90° C., preferably 45 to 85° C., preferably 50 to 80° C., preferably 55 to 75° C., preferably 60 to 70° C. The generation of the first reactant gas may involve agitation of the first solution. The agitation may be provided by any suitable method or equipment, for example a magnetic stirrer, a mechanical stirrer, a shaker, or an ultrasonic vibrator.

In some embodiments, the first reactant gas is a vapor. The vapor may comprise the first hafnium precursor and optionally comprise the first solvent. In such embodiments, the first hafnium precursor may be in the form of ions, compounds, or molecules in the gas phase. In alternative embodiments, the first reactant gas is an aerosol. Such an aerosol may comprise droplets comprising the first hafnium precursor and the first solvent.

The substrate may be a suitable conducting or semiconducting substrate. Examples of such suitable substrates include, but are not limited to silicon; fluorine-doped tin oxide (FTO); indium tin oxide (ITO); aluminum-doped zinc oxide, conducing polymers such as poly(3,4-ethylenedioxythiophene):poly(styrene sulfonate) (PEDOT:PSS), polypyrrole (PPy), and polyaniline (PAni); metals such as nickel, gold, chromium, platinum, titanium, stainless steel, and silver; gallium nitride, aluminum nitride, germanium, gallium arsenide, titanium dioxide, and graphene. The substrate may comprise a conducting or semiconducting layer disposed upon a non-conducting layer. The non-conducting layer may be constructed of a suitable non-conducting (insulating) material, for example glass, non-conducting polymer such as polystyrene or polyethylene terephthalate, sapphire (aluminum oxide), and mica. Alternatively, the substrate may comprise a first conducting or semiconducting layer disposed upon a second conducting or semiconducting layer. In preferred embodiments, the substrate is indium tin oxide (ITO), more preferably ITO disposed on glass (ITO/glass).

The flowing of the first reactant gas over the substrate generates a seed layer. The seed layer comprises particles of hafnium oxide. These particles form a base for the potential growth of the nanotubes. In some embodiments, the particles of hafnium oxide comprise cubic hafnium oxide. In alternative embodiments, the particles of hafnium oxide are substantially free of cubic hafnium oxide. In general, the particles may be any suitable shape. Examples of suitable shapes the hafnium oxide particles nanoparticles may take include spheres, spheroids, lentoids, ovoids, solid polyhedra such as tetrahedra, cubes, octahedra, icosahedra, dodecahedra, rectangular prisms, triangular prisms (also known as nanotriangles), nanoplatelets, nanodisks, blocks, flakes, discs, granules, angular chunks, and mixtures thereof. Nanorods or nanowires are not a shape that the hafnium oxide particles are envisioned as having in any embodiments.

In some embodiments, the hafnium oxide particles have uniform shape. Alternatively, the shape may be non-uniform. As used herein, the term "uniform shape" refers to an average consistent shape that differs by no more than 10%, by no more than 5%, by no more than 4%, by no more than 3%, by no more than 2%, by no more than 1% of the distribution of hafnium oxide particles having a different shape. As used herein, the term "non-uniform shape" refers to an average consistent shape that differs by more than 10% of the distribution of hafnium oxide particles having a different shape. In one embodiment, the shape is uniform and at least 90% of the hafnium oxide particles are spherical or substantially circular, and less than 10% are polygonal. In another embodiment, the shape is non-uniform and less than 90% of the hafnium oxide particles are spherical or substantially circular, and greater than 10% are polygonal.

In some embodiments, a mean particle size of the hafnium oxide particles in the seed layer is about 10 nm to about 35 nm, preferably 12.5 to 32.5 nm, preferably 15 to 30 nm, preferably 17.5 to 27.5 nm, preferably 20 to 25 nm, preferably about 22 nm. In embodiments where the hafnium oxide particles are spherical, the particle size may refer to a particle diameter. In embodiments where the hafnium oxide particles are polyhedral, the particle size may refer to the diameter of a circumsphere. In some embodiments, the particle size refers to a mean distance from a particle surface to particle centroid or center of mass. In alternative embodiments, the particle size refers to a maximum distance from a particle surface to a particle centroid or center of mass.

In some embodiments, the hafnium oxide particles are monodisperse, having a coefficient of variation or relative standard deviation, expressed as a percentage and defined as the ratio of the particle size standard deviation ($\sigma$) to the particle size mean ($\mu$) multiplied by 100 of less than 25%, preferably less than 10%, preferably less than 8%, preferably less than 6%, preferably less than 5%, preferably less than 4%, preferably less than 3%, preferably less than 2%. In some embodiments, the hafnium oxide particles of the present disclosure are monodisperse having a particle size distribution ranging from 80% of the average particle size to 120% of the average particle size, preferably 90-110%, preferably 95-105% of the average particle size. In some embodiments, the hafnium oxide particles are not monodisperse.

In some embodiments, the seed layer has a mean inter-particle spacing (referring to a separation distance between hafnium oxide particles) of 5 to 100 nm, preferably 7.5 to 90 nm, preferably 10 to 80 nm, preferably 12.5 to 75 nm, preferably 15 to 70 nm, preferably 17.5 to 60 nm, preferably 20 to 55 nm, preferably 25 to 50 nm.

In some embodiments, the seed layer has a (001) texture. As used herein, the texture refers to a crystallographic texture. A crystallographic texture is the distribution of crystallographic orientations in a polycrystalline sample. In preferred embodiments, the seed layer has a (001) texture in which less than 25%, preferably less than 20%, preferably less than 15%, preferably less than 10%, preferably less than 5% of the hafnium oxide particles have an orientation that deviates from having a (001) facet oriented parallel to a surface of the substrate by no more than 15°, preferably no more than 12.5°, preferably no more than 10°, preferably no more than 7.5°, preferably no more than 5°. It should be noted here that due to the cubic symmetry of the cubic hafnium oxide, the (100), (010), (001), (−100), (0-10), and (00-1) facets are crystallographically equivalent. Collectively, these facets may be referred to as a family. This family may also be referred to as {100}. The texture of the seed layer may be determined by a suitable technique, such as grazing-incidence PXRD or ellipsometry.

In some embodiments, the second hafnium precursor is at least one selected from the group consisting of hafnium nitrate, hafnium sulfate, hafnium chloride, hafnium bromide, hafnium (IV) iodide, hafnium (III) iodide, and hafnium trifluoromethanesulfonate. In preferred embodiments, the second hafnium precursor is hafnium is at least one selected from the group consisting of hafnium nitrate and hafnium sulfate. The second solvent may be any suitable solvent, as described above. In preferred embodiments, the second solvent comprises water. In some embodiments, the second solution comprises an ammonium salt. Examples of suitable ammonium salts include, but are not limited to ammonium chloride, ammonium bromide, ammonium iodide, ammonium acetate, ammonium sulfate, ammonium trifluoroacetate, ammonium trifluoromethanesulfonate, ammonium persulfate, ammonium carbonate, ammonium hydrogensulfate, ammonium bicarbonate, ammonium formate, ammonium nitrate, ammonium phosphate, ammonium hydrogenphosphate, ammonium dihydrogenphosphate, and ammonium citrate. In some embodiments, the second hafnium precursor is present in the second solution in an amount of 0.25 to 12.5 mg/mL, preferably 0.50 to 11.0 mg/mL, 0.75 to 10.0 mg/mL, preferably 0.90 to 9.5 mg/mL, preferably 1.0 to 9.0 mg/mL, preferably 1.10 to 8.5 mg/mL, preferably 1.20 to 8.0 mg/mL, preferably 1.30 to 7.5 mg/mL, preferably 1.40 to 7.0 mg/mL, preferably 1.50 to 6.5 mg/mL, preferably 1.60 to 6.0 mg/mL, preferably 1.70 to 5.5 mg/mL, preferably 1.80 to 5.0 mg/mL, preferably 1.9 to 4.5 mg/mL, preferably 2.0 to 4.0 mg/mL, preferably 2.25 to 3.75 mg/mL, preferably 2.50 to 3.50, preferably 2.60 to 3.40 mg/mL, preferably 2.70 to 3.30 mg/mL, preferably 2.80 to 3.20 mg/mL, preferably 2.90 to 3.10 mg/mL, preferably about 3.0 mg/mL. In some embodiments, the ammonium salt is present in the second solution in an amount of 0.25 to 12.5 mg/mL, preferably 0.50 to 11.0 mg/mL, 0.75 to 10.0 mg/mL, preferably 0.90 to 9.5 mg/mL, preferably 1.0 to 9.0 mg/mL, preferably 1.10 to 8.5 mg/mL, preferably 1.20 to 8.0 mg/mL, preferably 1.30 to 7.5 mg/mL, preferably 1.40 to 7.0 mg/mL, preferably 1.50 to 6.5 mg/mL, preferably 1.60 to 6.0 mg/mL, preferably 1.70 to 5.5 mg/mL, preferably 1.80 to 5.0 mg/mL, preferably 1.9 to 4.5 mg/mL, preferably 2.0 to 4.0 mg/mL, preferably 2.25 to 3.75 mg/mL, preferably 2.50 to 3.50, preferably 2.60 to 3.40 mg/mL, preferably 2.70 to 3.30 mg/mL, preferably 2.80 to 3.20 mg/mL, preferably 2.90 to 3.10 mg/mL, preferably about 3.00 mg/mL. In some embodiments, the ammonium salt is present in the second solution in an amount equal to the amount of the second hafnium precursor is present in the second solution. In alternative embodiments, the ammonium salt is present in the second solution in an amount greater than or less than the amount of the second hafnium precursor is present in the second solution. In some embodiments, said equality is based on a weight of the second hafnium precursor. In some embodiments, a number of moles of the ammonium salt present in the second solution may be equal to a number of moles of the second hafnium precursor present in the second solution. In some embodiments, the number of moles of the ammonium salt present in the second solution is no equal to a number of moles of the second hafnium precursor present in the second solution. The generation of the second reactant gas may involve heating of the second solution. In some embodiments, the second solution is heated to 50 to 125° C., preferably 65 to 120° C. preferably 70 to 115° C., preferably 75 to 110° C., preferably 80 to 105° C., preferably 85 to 100° C., preferably 90 to 95° C. The generation of the second reactant gas may involve agitation of the second solution. The agitation may be provided by any suitable method or equipment, for example a magnetic stirrer, a mechanical stirrer, a shaker, or an ultrasonic vibrator.

The second reactant gas may be a vapor or an aerosol as described above. In some embodiments, the second reactant gas is similar in identity (i.e. is an aerosol) to the first reactant gas. Alternatively, the second gas may be different in identity from the first reactant gas.

The array of aligned hafnium oxide nanotubes is alternatively referred to as "the nanotubes" in the present disclosure. In some embodiments, the nanotubes have a mean length of about 100 nm to about 150 nm, preferably 102.5 to 147.5 nm, preferably 105 to 145 nm, preferably 107.5 to 142.5 nm, preferably 110 to 140 nm, preferably 112.5 to 137.5 nm, preferably 115 to 135 nm, preferably 117.5 to 132.5 nm, preferably 120 to 130 nm, preferably 122.5 to 127.5 nm, preferably about 125 nm. In some embodiments, the nanotubes have a mean inner diameter of about 10 nm to about 25 nm, preferably 10.5 to 24.5 nm, preferably 11 to 24 nm, preferably 11.5 to 23.5 nm, preferably 12 to 23 nm, preferably 12.5 to 22.5 nm, preferably 13 to 22 nm, preferably 13.5 to 21.5 nm, preferably 14 to 21 nm, preferably 14.5 to 20.5 nm, preferably 15 to 20 nm, preferably 15.5 to 19.5 nm, preferably 16 to 19 nm, preferably 16.5 to 18.5 nm, preferably 17 to 18 nm. In some embodiments, the nanotubes have a mean outer diameter of about 11 nm to about 35 nm, preferably 11.5 to 34 nm, preferably 12 to 33 nm, preferably 12.5 to 32 nm, preferably 13 to 31 nm, preferably 13.5 to 30.5 nm, preferably 14 to 30 nm, preferably 14.5 to 29.5 nm, preferably 15 to 29 nm, preferably 15.5 to 28.5 nm, preferably 16 to 28 nm, preferably 16.5 to 27.5 nm, preferably 17 to 27 nm, preferably 17.5 to 26.5 nm, preferably 18 to 26 nm, preferably 18.5 to 25.5 nm, preferably 19 to 25 nm, preferably 19.5 to 24.5 nm, preferably 20 to 24 nm, preferably 20.5 to 23.5 nm, preferably 21 to 23 nm, preferably 21.5 to 22.5 nm, preferably about 22 nm. The nanotubes may have a monodisperse length, a monodisperse inner diameter, and/or a monodisperse outer diameter. Alternatively, the length, inner diameter, and/or outer diameter may not be monodisperse. In some embodiments, the nanotubes have an inner diameter and/or outer diameter which do not change along the length of the nanotubes. In alternative embodiments, the nanotubes have an inner diameter and/or outer diameter which changes along the length of the nanotubes. Such change may involve an increase or decrease in the inner diameter and/or outer diameter along the length of the nanotube moving in a direction away from the substrate. Such change may be referred to as tapering.

In some embodiments, the nanotubes have a tube wall thickness of about 1 nm to about 10 nm, preferably about 1.25 to 9.75 nm, preferably 1.5 to 9.5 nm, preferably 1.75 to 9.25 nm, preferably 2 to 9 nm, preferably 2.25 to 8.75 nm, preferably 2.5 to 8.5 nm, preferably 2.75 to 8.25 nm, preferably 3 to 7 nm, preferably 3.25 to 6.75 nm, preferably 3.5 to 6.5 nm, preferably 3.75 to 6.25 nm, preferably 4 to 6 nm, preferably 4.25 to 5.75 nm, preferably 4.5 to 5.5 nm, preferably 4.75 to 5.25 nm, preferably 4.9 to 5.1 nm, preferably about 5 nm.

Figure 3A:
FIGS. 3A-3C are electron microscopy images of the nanotubes, according to an embodiment of the present disclosure.
Figure 3B:
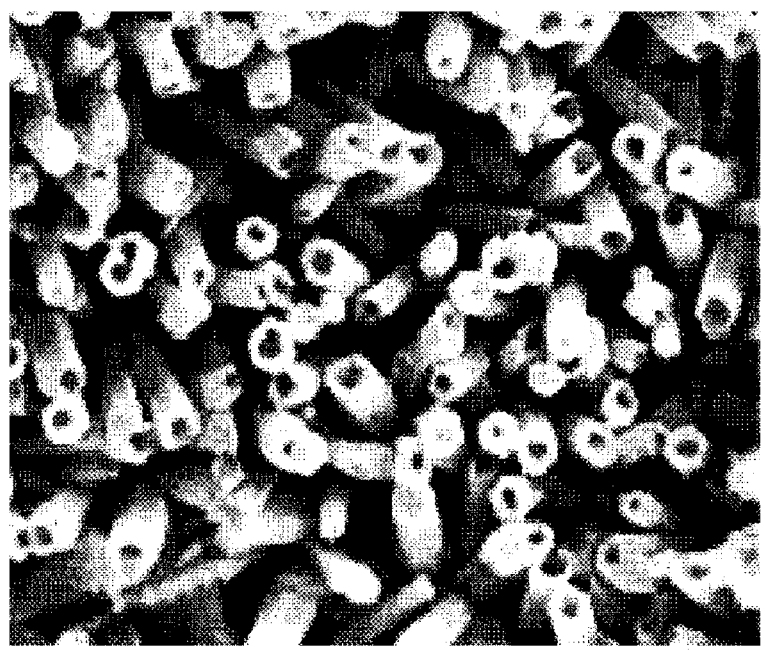
Figure 3C:
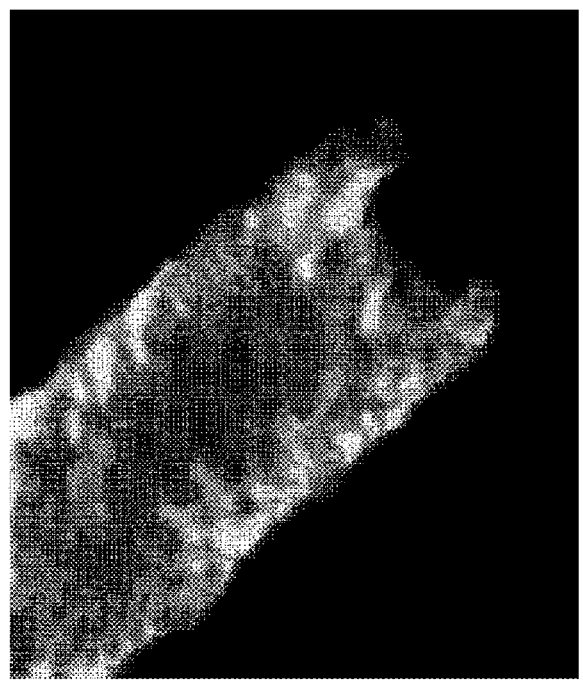
Figure 3D:
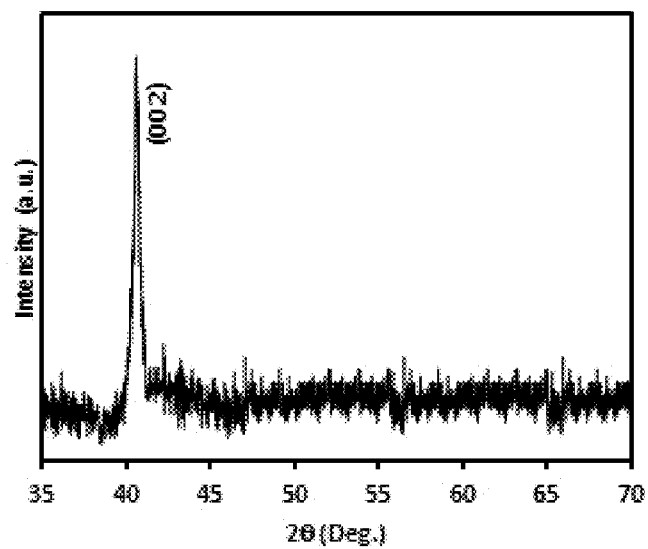
FIG. 3D is a PXRD diffraction pattern of the array of hafnium oxide nanotubes, according to an embodiment of the present disclosure.

FIGS. 3A-3C show images of the nanotubes captured by the scanning electron microscope, according to an embodiment of the present disclosure. FIG. 3A shows a side view of the array of aligned hafnium oxide nanotubes. It can be observed that the nanotubes formed are structurally similar to each other. FIG. 3B depicts a top view of the nanotubes formed by the method, showing the hollow structure of the nanotubes. The hollow structure may be advantageous for increasing surface area available for gas sensing or for facilitating gas travel within the nanotubes. FIG. 3C shows a close view of a single nanotube from the array of nanotubes.

The nanotubes may form an angle "θ" (shown in FIG. 4A) between a vertical axis "X" of the nanotubes (oriented along the length of the nanotubes) and the surface of the substrate 414. In some embodiments, at least 75% of the nanotubes, preferably at least 80%, preferably at least 85%, preferably at least 90%, preferably at least 92.5%, preferably at least 95%, preferably at least 97.5%, preferably at least 99%, preferably at least 99.5% of the nanotubes form the angle "θ" about 75° to about 105°, preferably about 80° to about 100°, preferably about 85° to about 95°, preferably about 87.5° to about 92.5°, preferably about 90°.

Gas Sensor

Aspects of the present disclosure relate to a gas sensor containing an array of aligned hafnium oxide nanotubes for the detection of toxic gases. The array of hafnium oxide nanotubes are preferably as described above. The gas sensor may be used to detect the presence and/or concentration of toxic gases such as $NO_2$, $NH_3$, $H_2S$, and CO. The gas sensor further comprises a conducting or semiconducting substrate and a pair of electrodes separated by an electrode separation distance, one of the electrodes being disposed on the conducting or semiconducting substrate and another of the electrodes being disposed on a portion of the array.

In general, the conducting or semiconducting substrate may be as described above. In some embodiments, the substrate 402 may be disposed upon a glass support 406.

The first electrode 416 and the second electrode 418 are separated by an electrode separation distance "D". In some embodiments, the first electrode 416 and the second electrode 418 may be formed by corrosion-resistant material, such as but not limited to, copper, gold, silver, nickel, platinum, titanium, and tungsten. The use of corrosion-resistant material for the formation of the first electrode 116 and the second electrode 118 may be advantageous for reducing possible damage to the electrodes which may be caused by toxic gases. In some embodiments, the first electrode 416 and the second electrode 418 may have a thickness "Te" (shown in FIG. 4B).

Figure 4A:
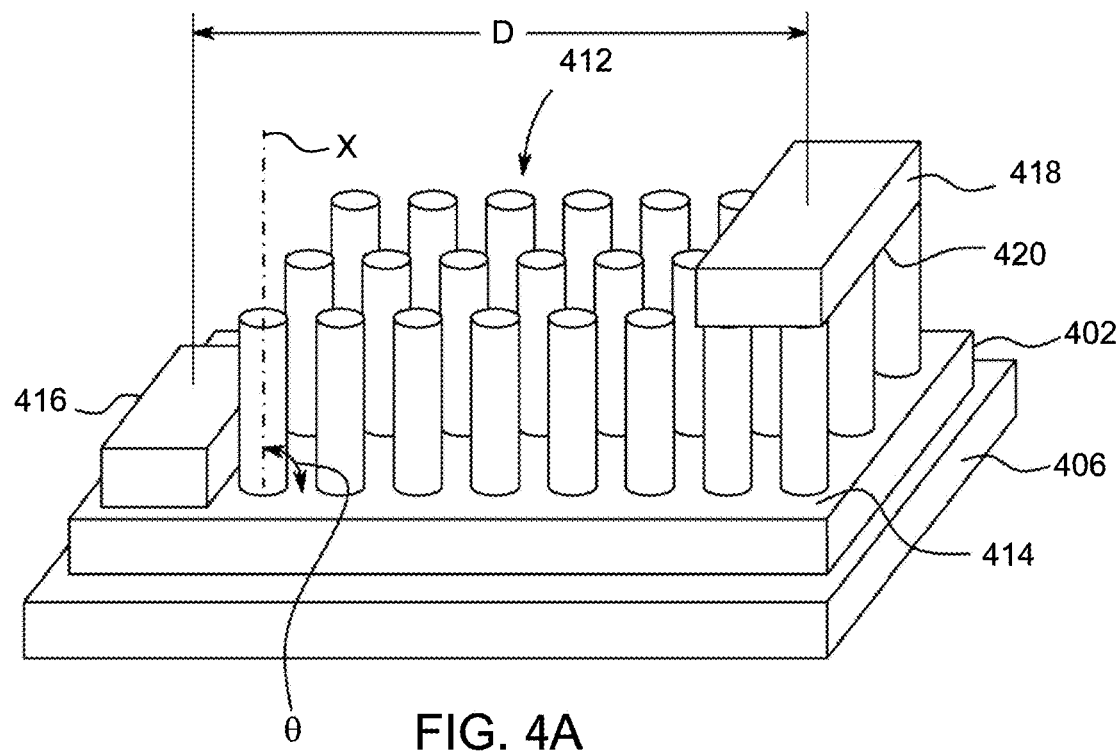
FIG. 4A shows a configuration of disposing electrodes on conducting or semiconducting substrate and nanotubes of the gas sensor, according to an embodiment of the present disclosure.
Figure 4B:
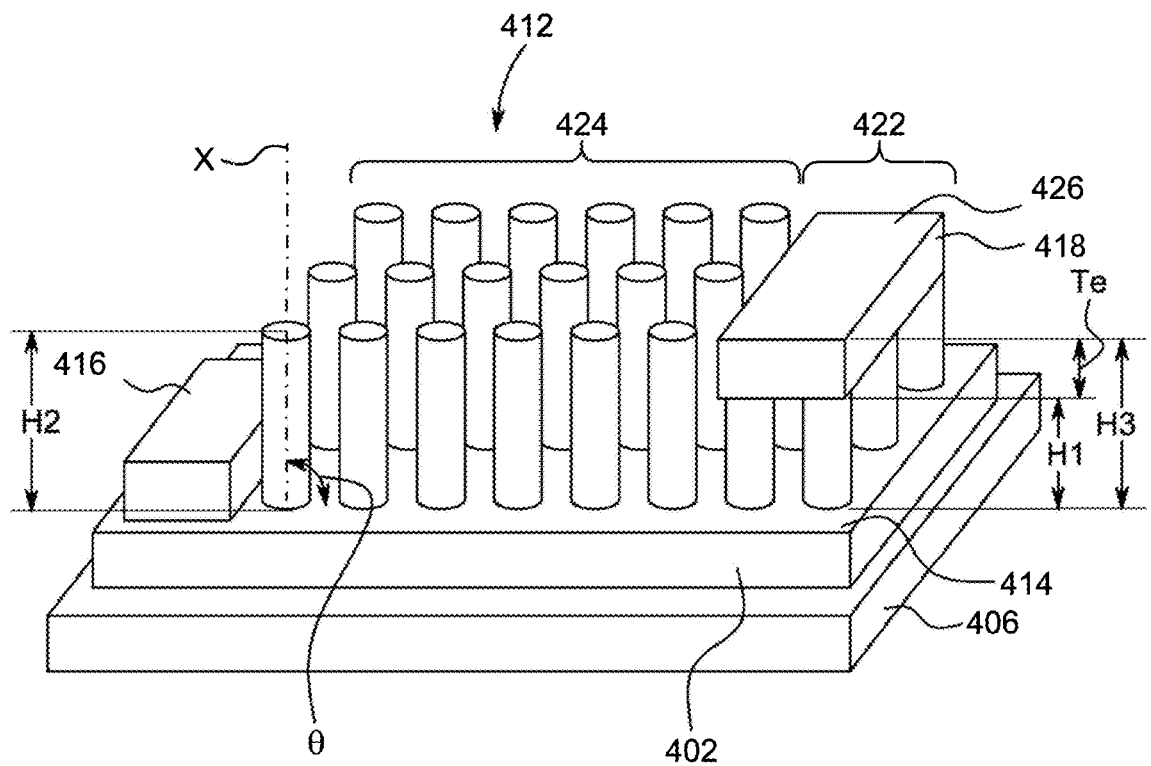
FIG. 4B shows a configuration of disposing electrodes on conducting or semiconducting substrate and nanotubes of the gas sensor, according to another embodiment of the present disclosure.

FIGS. 4A and 4B illustrate two exemplary configurations of disposing the first electrode 416 on the conducting or semiconducting substrate 402 and the second electrode 418 over the nanotubes 412. In one embodiment, all the nanotubes 412 may have uniform height, such that the second electrode 418 disposed on the portion 420 of the nanotubes 412 may rise above the level of the nanotubes 412. This configuration may be achieved by disposing the second electrode 418 after the complete formation of the nanotubes 412. In another embodiment depicted in FIG. 4B, the nanotubes 412 may form a first region 422 having a height "H1" and a second region 424 having a height "H2", such that the height "H1" is less than the height "H2" as shown in FIG. 2B. The second electrode 418 disposed on the first region 422 of the nanotubes 412 may form a collective height "H3" of the second electrode 418 and the first region 422 that may be equal to the height "H2" of the second region 424. The difference between the height "H2" of the second region 424 and the height "H1" of the first region 422 may be equal to the thickness "Te" of the second electrode 418.

In some embodiments, the first region 422 may be formed by removing a portion of the nanotubes 412. The portion removed in such a way that a top surface 426 of the second electrode 418 disposed on the first region 422 may align with the level of the second region 424. In another embodiment, the first region 422 may be formed by forming the nanotubes 412 up to the height "H1", disposing the second electrode 418 on the first region 422, and continuing the formation of nanotubes 412 on the second region 424 up to the height "H2".

Figure 5:
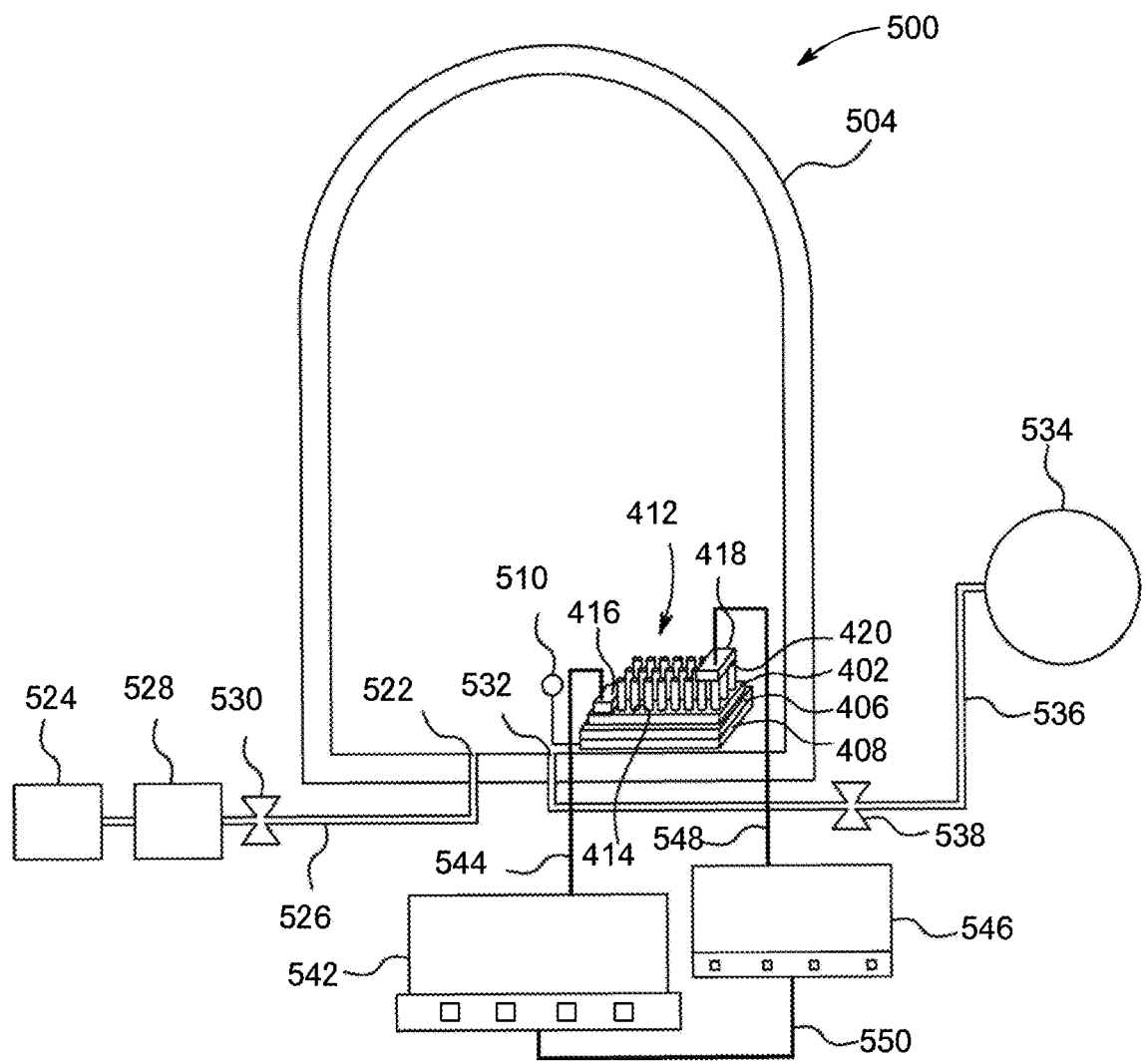
FIG. 5 is a schematic diagram showing a gas sensor containing an array of aligned hafnium oxide nanotubes, according to an embodiment of the present disclosure.

FIG. 5 illustrates an exemplary gas sensor 500, according to an embodiment of the present disclosure. In some embodiments, the gas sensor 500 includes a substrate 402, contained in an air-tight glass container 504. In some embodiments, the substrate 402 may be disposed upon a glass support 406. In another embodiment, the glass support 406 may be mounted on a flat heater 408. This flat heater 408 may be connected with a temperature controller 510 to adjust an operating temperature of the array. The gas sensor 500 further includes an array of aligned hafnium oxide nanotubes 412 disposed on a surface 414 of the substrate 402 and substantially perpendicular to the substrate 402 as described above.

The air-tight glass container 504 includes a first inlet 522 connected to a gas source 524 containing the gas to be detected via a first tubular pipe 526. The gas sensor 500 includes a mass flow meter 528 to control the flow of gas from the gas source 524 entering the air-tight glass container 504 and a first valve 530 attached between the first inlet 522 and the mass flow meter 528. The air-tight glass container 504 further includes a first outlet 532 connected to a vacuum pump 534 via a second tubular pipe 536 and a second valve 538 attached between the vacuum pump 534 and the first outlet 532. The vacuum pump 534 is used to remove the gas periodically and maintain the pressure inside the air-tight glass container 504. The gas sensor 500 also includes a power supply 542 connected to the first electrode 416 via a first probe 544 and an electrometer 546 connected to the second electrode 418 via a second probe 548. The power supply 542 and the electrometer 546 are mutually connected to form a complete circuit via third probe 550. Further, the electric circuit is connected to a computer via a data acquisition system to collect and display the data.

Method of Detecting a Toxic Gas

Figure 6:
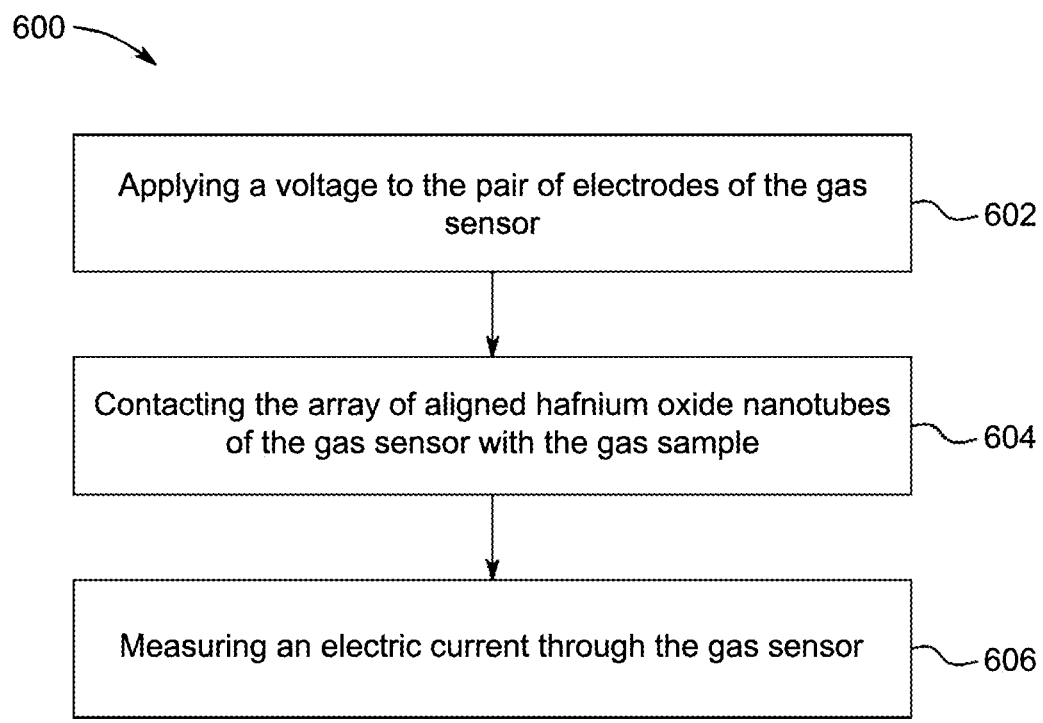
FIG. 6 is a schematic flow diagram of a method of detecting a toxic gas in a gas sample, according to an embodiment of the present disclosure.

FIG. 6 illustrates a schematic flow diagram of a method 600 of detecting a toxic gas in a gas sample, according to an embodiment of the present disclosure. The method 600 of detecting the toxic gas from the gas sample is described with reference to the gas sensor 500 illustrated in FIG. 5. The gas sensor 500 detects the toxic gas by calculating a resistance "Rg" offered by the toxic gas in comparison with a resistance "Ra" offered by the air. The resistance "R" is calculated by keeping either the voltage "V" or the current "I" constant in the formula R=V/I. At step 602, the method 600 includes applying a voltage "V1" to the first electrode 416 and the second electrode 418 of the gas sensor 100. At first, only the air present in the air-tight glass container 504 is evaluated for resistance using the gas sensor 500. The resistance "Ra" is calculated by the electrometer 546 that is in communication with the data acquisition system.

At step 604, the method 600 includes contacting the nanotubes 412 of the gas sensor 500 with the gas sample. The gas sample flows from the gas source 524 to the air-tight glass container 504 through the first tubular pipe 526. The mass flow meter 528 controls the flow of the gas sample passing through the first tubular pipe 526. At step 606, the method 600 includes measuring an electric current "I1" through the gas sensor 500. The change in the electric current "I1" at the constant voltage "V1" indicates the presence of the toxic gas in the gas sample. The resistance of the gas sample "Rg" is calculated by using the values of the electric current "I1" and the constant voltage "V1". In some embodiment, an amount of toxic gas present in the gas sample may be in the range of about 0.0001 ppb to about 1000 ppb, preferably 0.00025 to 750 ppb, preferably about 0.0005 to 500 ppb, preferably 0.00075 to 250 ppb, preferably 0.001 to 100 ppb. In another embodiment, the amount of toxic gas present in the gas sample may be in the range of about 0.1 to 1000 ppb, preferably about 0.25 to 750 ppb, preferably about 0.5 to 500 ppb, preferably about 0.75 to 250 ppb, preferably about 1 to 100 ppb. In another embodiment, the amount of toxic gas present in the gas sample may be in the range of about preferably 0.0001 to 10 ppb, preferably 0.00025 to 7.5 ppb, preferably 0.0005 to 5 ppb, preferably 0.0075 to 2.5 ppb, preferably 0.001 to 1 ppb. In some embodiments, the toxic gas is at least one selected from the group consisting of ammonia, hydrogen sulfide, and nitrogen dioxide. The sample gas may be taken out from the air-tight glass container 504 periodically by the vacuum pump 534 via the second tubular pipe 536.

The gas sensor 500 may have a sensitivity "S" defined as the change in output with respect to the change in the input. The sensitivity "S" is calculated as the relative change in the resistance of the nanotube array between the first and second electrodes and is represented by the formula (1), $$S = \frac{Rg - Ra}{Ra} \quad (1)$$

Where "Rg" is the resistance of the gas sample and "Ra" is the resistance of the air calculated by the gas sensor 500. In one embodiment, the method 600 may include calculating a concentration of the toxic gas from the gas sample by using a magnitude of the changes in the electric current.

The change in the resistance of the nanotube array between the first and second electrodes may be due to interaction of the toxic gas with the nanotubes. This interaction may be any suitable type of interaction known to one of ordinary skill in the art. This interaction may be a specific chemisorption interaction which forms chemical bonds or involves a chemical reaction between the toxic gas and the nanotube surface. Such bonds may be covalent or noncovalent. Alternatively, this interaction may be a physisorption interaction, for example electrostatic interactions such as ion (or charged species in general)-ion interactions, ion-dipole interactions, or dipole-dipole interactions; and Van der Waals interactions. Preferably, this interaction is reversible, allowing a desorption or other release of the toxic gas from the nanotubes. Preferably, this interaction does not permanently alter the chemical makeup or physical properties of the nanotubes after such desorption or release of the toxic gas from the nanotubes.

Figure 7:
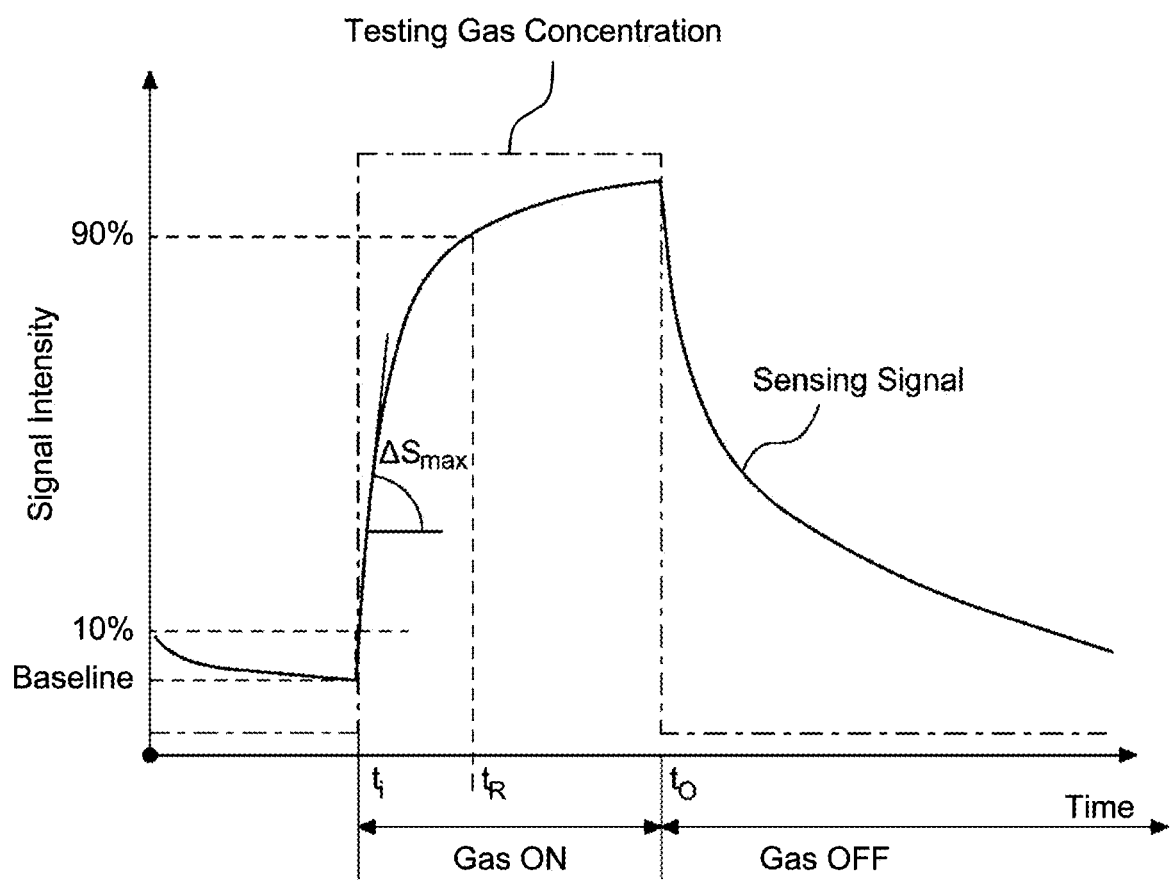
FIG. 7 is a graphical representation showing a response curve of the gas sample in the gas sensor, according to an embodiment of the present disclosure.

FIG. 7 depicts a graphical diagram illustrating a response curve of the gas sample in the gas sensor 500, according to an embodiment of the present disclosure. The graphical diagram includes a time "ti" at which the gas sample enters the air-tight glass container 504 and a time "to" at which the gas sample exists from the air-tight glass container 504. The graphical diagram further includes a response time "tr", defined as the time required for a sensor to reach 90% of the total response of the signal, and a recovery time "te", defined as the time required for a sensor to return to 90% of the original baseline signal. In one embodiment, the method 600 may have the response time "tr" in the range of about 0.5 sec to about 3, preferably 0.75 to 2.5 sec, preferably 1 to 2.25 sec and the recovery time "te" in the range of about 0.5 sec to about 2.5 sec, preferably 0.75 to 2 sec, preferably 1 to 1.6 sec. A response speed may be calculated by a maximum slope ($\Delta S_{max}$) of the response curve formed by the gas sample tested by the gas sensor 100. The response time "tr" of the gas sensor 500 is very quick as 90% of the signal is achieved in a very short time as shown in FIG. 7.

Examples

The following examples are provided to illustrate further and to facilitate the understanding of the present disclosure.

In an experiment, the nanotubes were examined for the detection of oxidizing gas as well as reducing gas using the gas sensor. The $NO_2$ gas is considered as an example of the oxidizing gas while $NH_3$ gas and $H_2S$ gas are considered as examples of the reducing gas. For discussion in this document, $NO_2$, $NH_3$, and $H_2S$ gas are considered for detection in the gas sample by the gas sensor.

Figure 8A:
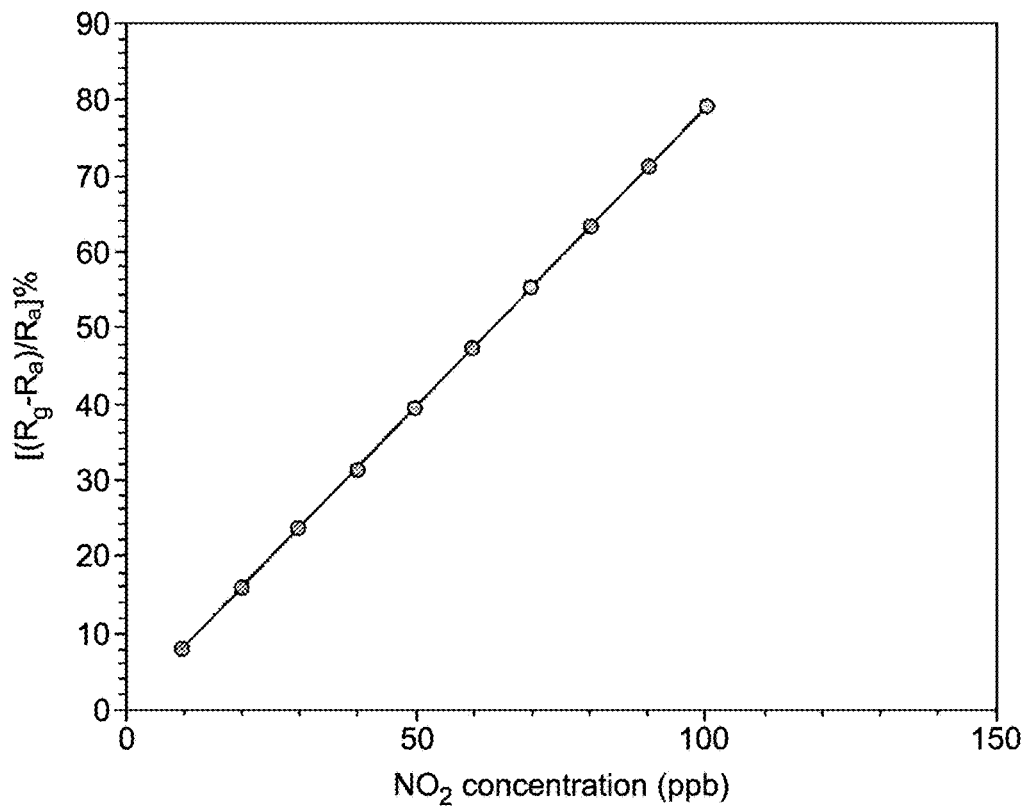
FIGS. 8A-8C are graphical representations of the electrical response of the gas sensor where FIGS. 8A-8B each show a calibration curve defined between concentration and sensitivity plot of $NO_2$ gas with FIG. 8A showing a range from 10 to 100 ppb and FIG. 8B showing a range from 0 to 1 ppb.
Figure 8B:
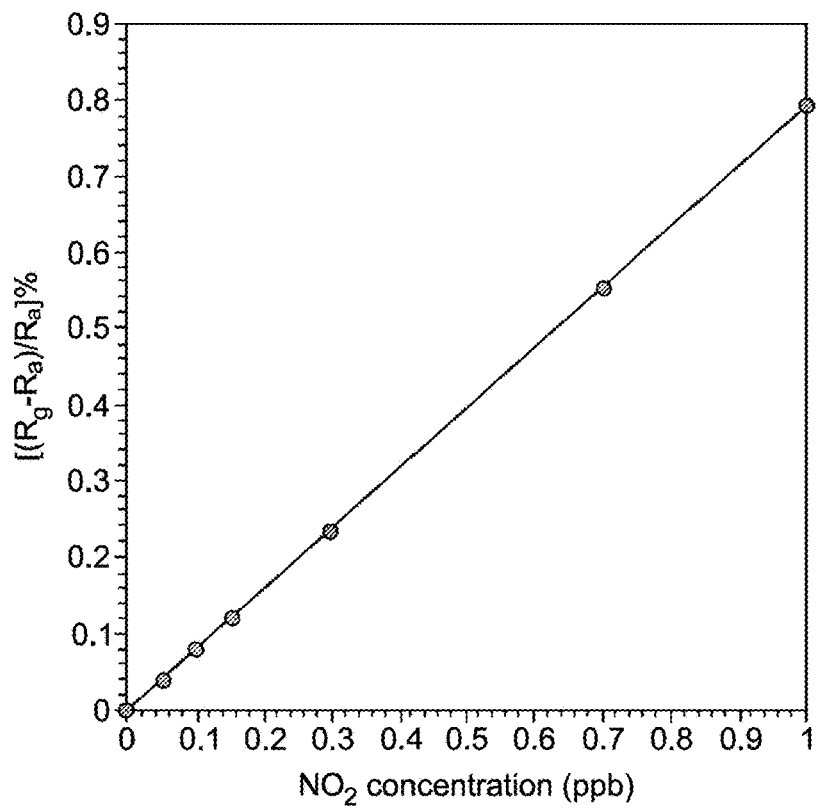
Figure 8C:
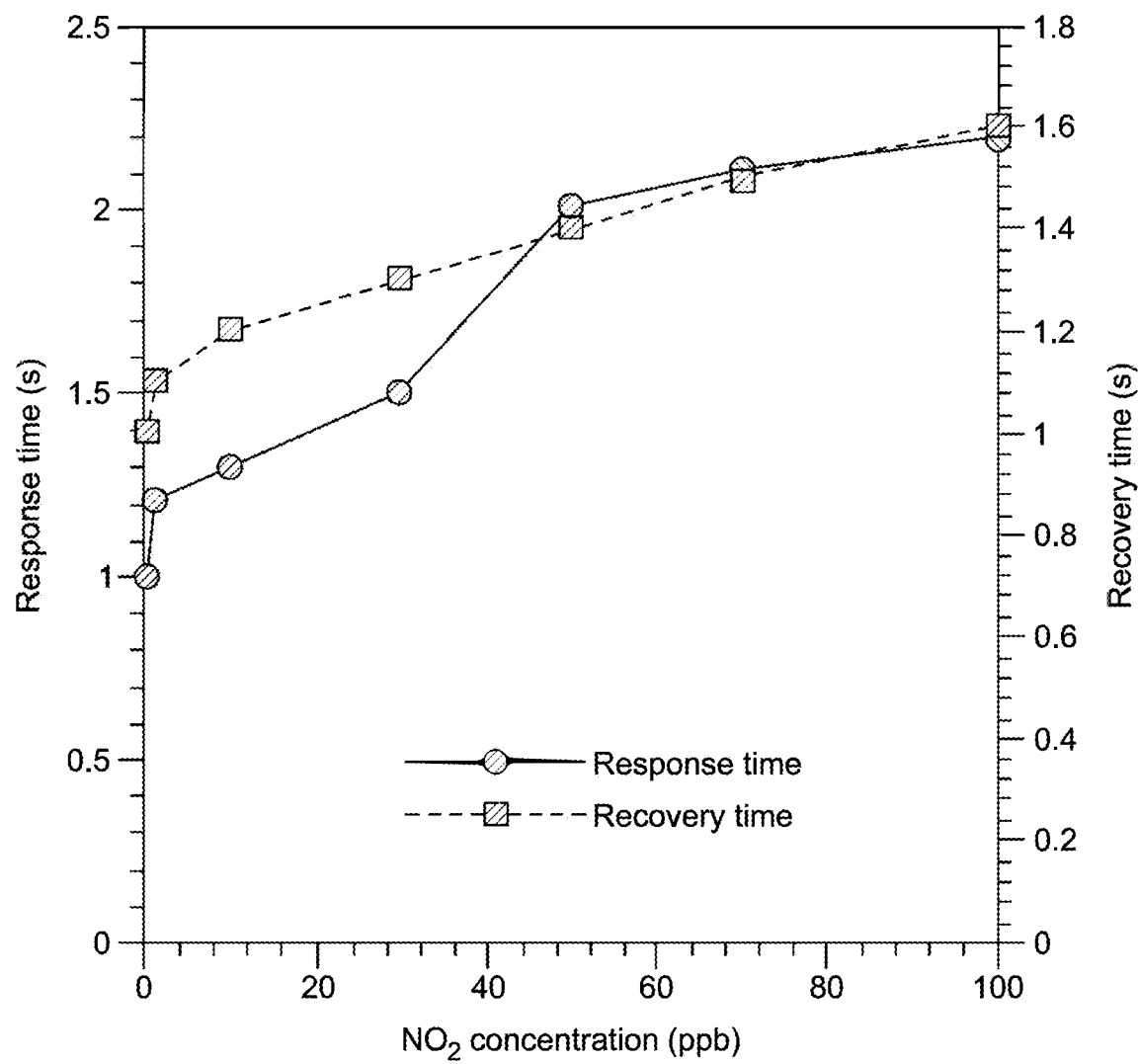

FIGS. 8A and 8B show a graphical representation of a calibration curve defined between concentration and sensitivity plot of $NO_2$ gas, according to exemplary aspects of the present disclosure. The $NO_2$ gas was passed through the first tubular pipe from the gas source via the mass flow meter at different concentrations from 0.001 ppb to 100 ppb. Keeping the voltage constant the current was detected for every concentration and the resistance was calculated. The sensitivity data was obtained at every concentration using the formula (1). FIG. 8A shows the plot of sensitivity for high concentration ranges, it is observed that the sensitivity increases with an increase in the concentration of $NO_2$ gas, and a linear relationship is observed for this plot. FIG. 8B shows the plot of sensitivity for lower concentrations, it is observed that the sensitivity increases with an increase in the concentration of $NO_2$ gas, and a linear relationship is observed, the line of best fit passing through the intersection of the axis. FIG. 8C shows a graphical representation of response time and recovery time with the change in concentration of $NO_2$ gas, according to exemplary aspects of the present disclosure. The gas sensor containing the nanotubes shows very fast detection in the range of about 1 sec to about 2.2 sec and fast recovery time in the range of about 1 sec to about 1.6 sec.

Figure 9:
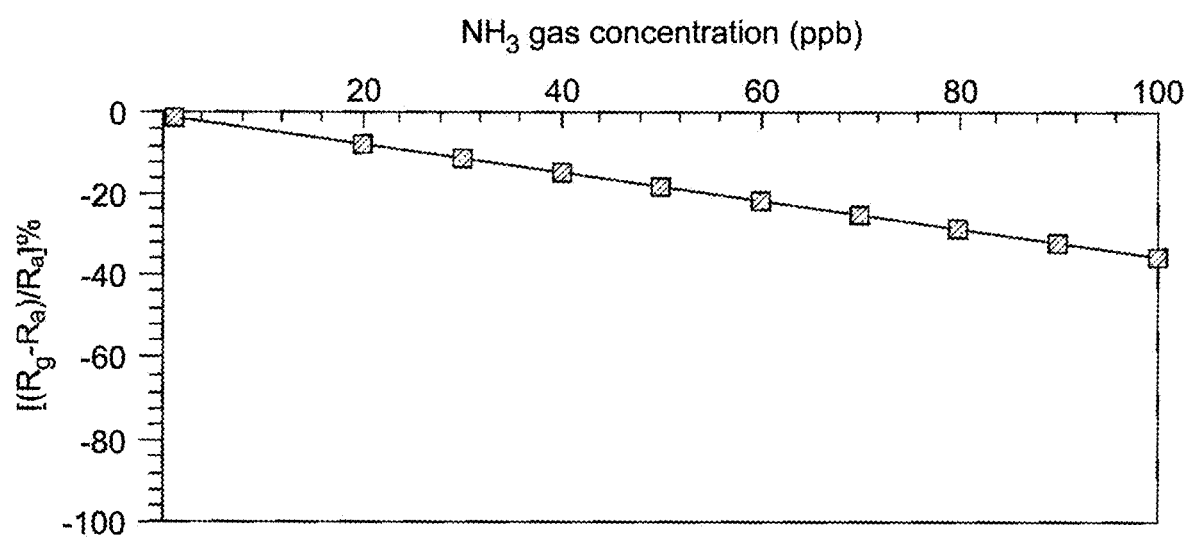
FIG. 9 is a graphical representation showing a calibration curve defined between concentration to sensitivity plot of $NH_3$ gas, according to an embodiment of the present disclosure.

FIG. 9 shows a graphical representation of a calibration curve defined between concentration to sensitivity plot of $NH_3$ gas, according to exemplary aspects of the present disclosure. The $NH_3$ gas was passed through the first tubular pipe from the gas source via the mass flow meter at different concentrations from 0.001 ppb to 100 ppb. Keeping the voltage constant the current was detected for every concentration and the resistance was calculated. The sensitivity data was obtained at every concentration using the formula (1). FIG. 9 shows the plot of sensitivity for different concentration ranges, it is observed that the value of sensitivity decreases with an increase in the concentration of $NH_3$ gas and a linear straight relationship is observed for this plot. Further, the value of the sensitivity obtained is negative, this is because $NH_3$ acts as a reducing gas.

Figure 10:
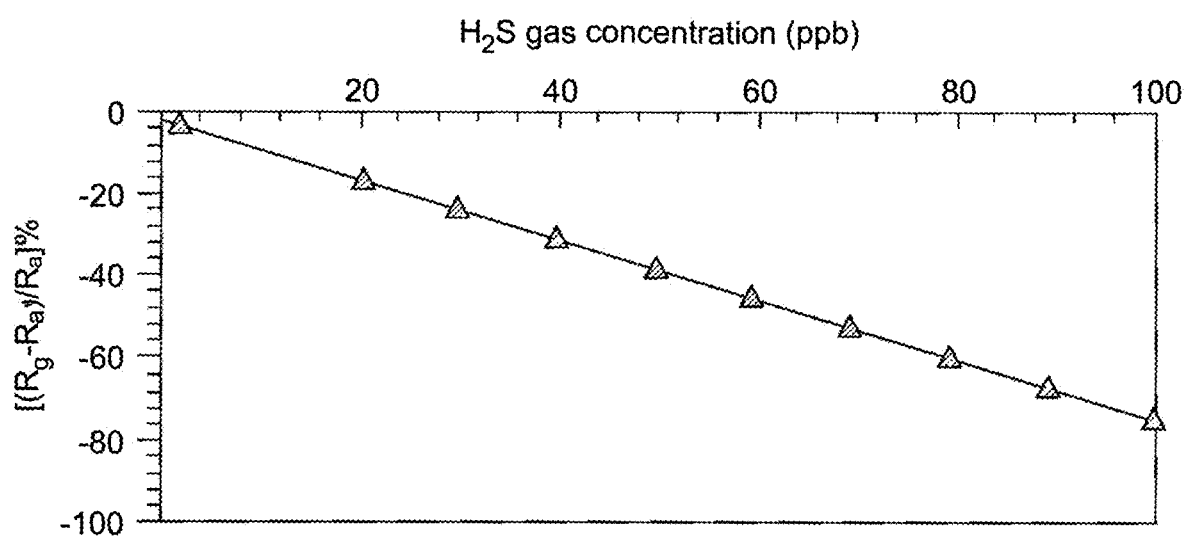
FIG. 10 is a graphical representation showing a calibration curve defined between concentration to sensitivity plot of $H_2S$ gas, according to an embodiment of the present disclosure.

FIG. 10 shows a graphical representation of a calibration curve defined between concentration to sensitivity plot of $H_2S$ gas, according to exemplary aspects of the present disclosure. The $H_2S$ gas was passed through the first tubular pipe from the gas source via the mass flow meter at different concentrations from 0.001 ppb to 100 ppb. Keeping the voltage constant the current was detected for every concentration and the resistance was calculated. The sensitivity data was obtained at every concentration using the formula (1). FIG. 10 shows the plot of sensitivity for different concentration ranges, it is observed that the sensitivity decreases with an increase in the concentration of $H_2S$ gas and a linear relationship is observed for this plot. Further, the value of the sensitivity obtained is negative, this is because $H_2S$ acts as a reducing gas.

The experimental results conclude that the sensor containing the array of hafnium oxide nanotubes formed by the method of the present disclosure shows fast detection of toxic gases and can detect a very small amount of these gases in the range of about 0.001 to 100 ppb. Further, the nanotubes can easily differentiate between the oxidizing gas and the reducing gas based on the value of the sensitivity obtained. A positive value for sensitivity shows that the gas is oxidizing gas and a negative value for sensitivity shows that the gas is reducing gas. As such, advantages of the present disclosure include the versatility of detecting multiple different gases, speed of the detection, very high sensitivity of the disclosed array to the very low concentration of the gases, ability of the method to differentiate between oxidizing and reducing gases, and the repeated use of the method using the same setup because the array can be ready for reuse in a short amount of time without loss of activity or sensitivity.

Obviously, numerous modifications and variations of the present invention are possible in light of the above teachings. It is, therefore, to be understood that, within the scope of the appended claims, the invention may be practiced otherwise than as specifically described herein.

The invention claimed is:

1. A method of making an array of aligned hafnium oxide nanotubes, the method comprising:
   generating a first reactant gas from a first solution comprising a first hafnium precursor dissolved in a first solvent;
   flowing the first reactant gas over a substrate at 120 to 200° C. to form a seed layer;
   generating a second reactant gas from a second solution comprising a second hafnium precursor dissolved in a second solvent; and
   flowing the second reactant gas over the seed layer at 120 to 200° C. to form the array of aligned hafnium oxide nanotubes,
   wherein:
   the seed layer comprises particles of hafnium oxide;
   the hafnium oxide nanotubes are cubic hafnium oxide; and the hafnium oxide nanotubes are aligned substantially perpendicular to a surface of the substrate.

2. The method of claim 1, wherein the first hafnium precursor is at least one selected from the group consisting of hafnium acetate, hafnium formate, hafnium acetylacetonate, hafnium trifluoroacetate, and hafnium hexafluoroacetylacetonate.

3. The method of claim 1, wherein the seed layer comprises particles of hafnium oxide having a mean particle size of 10 to 35 nm.

4. The method of claim 1, wherein the second hafnium precursor is at least one selected from the group consisting of hafnium nitrate, hafnium sulfate, hafnium chloride, hafnium bromide, hafnium (IV) iodide, hafnium (III) iodide, and hafnium trifluoromethanesulfonate.

5. The method of claim 1, wherein:
the first solvent is an alcohol; and
the second solvent is water.

6. The method of claim 1, wherein the hafnium oxide nanotubes have a mean length of 100 to 150 nm, a mean inner diameter of 10 to 25 nm, a mean outer diameter of 11 to 35 nm, and a mean tube wall thickness of 1 to 10 nm.

7. The method of claim 1, wherein the hafnium oxide nanotubes are crystalline by PXRD.

8. The method of claim 1, wherein the substrate is indium tin oxide.

9. The method of claim 8, wherein the indium tin oxide is disposed upon a glass support.

10. The method of claim 1, further comprising disposing a pair of electrodes, a first electrode being disposed on the conducting or semiconducting substrate and a second electrode being disposed on a portion of the array of aligned hafnium oxide nanotubes.

11. The method of claim 10, wherein each of the electrodes comprises a metal selected from the group consisting of copper, gold, silver, nickel, platinum, titanium, and tungsten.

12. The method of claim 10, further comprising removing a portion of the array to create a first region and a second region.

13. A gas sensor, comprising:
a conducting or semiconducting substrate,
an array of aligned hafnium oxide nanotubes disposed substantially perpendicular on a surface of the conducting or semiconducting substrate, the nanotubes having a mean length of 100 to 150 nm, a mean inner diameter of 10 to 25 nm, a mean outer diameter of 11 to 35 nm, and a mean tube wall thickness of 1 to 10 nm; and
a pair of electrodes separated by an electrode separation distance, one of the electrodes being disposed on the conducting or semiconducting substrate and another of the electrodes being disposed on a portion of the array.

14. The gas sensor of claim 13, wherein the conducting or semiconducting substrate is indium tin oxide.

15. The gas sensor of claim 13, wherein the hafnium oxide is cubic hafnium oxide.

16. A method of detecting a toxic gas in a gas sample, the method comprising:
applying a voltage to the pair of electrodes of the gas sensor of claim 13;
contacting the array of aligned hafnium oxide nanotubes of the gas sensor with the gas sample; and
measuring an electric current through the gas sensor,
wherein changes in the electric current indicate the presence of the toxic gas.

17. The method of claim 16, wherein the toxic gas is present in the gas sample in an amount of 0.0001 to 1000 ppb based on a total number of parts in the gas sample.

18. The method of claim 16, wherein the toxic gas is at least one selected from the group consisting of ammonia, hydrogen sulfide, and nitrogen dioxide.

19. The method of claim 16, wherein the method has a response time of 0.5 to 3 sec and a recovery time of 0.5 to 2.5 seconds.

20. The method of claim 16, further comprising calculating, using a magnitude of the changes in the electric current, a concentration of the toxic gas in the gas sample.

\* \* \* \* \*

UNITED STATES PATENT AND TRADEMARK OFFICE
CERTIFICATE OF CORRECTION

| | |
|---|---|
| PATENT NO. | : 11,320,393 B1 |
| APPLICATION NO. | : 17/392852 |
| DATED | : May 3, 2022 |
| INVENTOR(S) | : Elsayed et al. |

It is certified that error appears in the above-identified patent and that said Letters Patent is hereby corrected as shown below:

In the Specification

Column 1, Line 10 after the title of the invention, please insert:
--STATEMENT OF ACKNOWLEDGEMENT
The inventors extend their appreciation to the Deputyship for Research & Innovation, Ministry of Education in Saudi Arabia for funding this research work through the project number (IFPNC-004- 130-2020) and King Abdulaziz University, DSR, Jeddah, Saudi Arabia.--

Signed and Sealed this
Twenty-first Day of June, 2022

*Katherine Kelly Vidal*

Katherine Kelly Vidal
*Director of the United States Patent and Trademark Office*